United States Patent
Morgan

(10) Patent No.: US 8,759,214 B2
(45) Date of Patent: Jun. 24, 2014

(54) METHOD OF ETCHING A SEMICONDUCTOR WAFER

(75) Inventor: Russell Morgan, East Cowes (GB)

(73) Assignee: Radiation Watch Limited, East Cowes (GB)

( * ) Notice: Subject to any disclaimer, the term of this patent is extended or adjusted under 35 U.S.C. 154(b) by 730 days.

(21) Appl. No.: 12/377,588

(22) Filed: Feb. 13, 2009

(65) Prior Publication Data

US 2011/0008959 A1    Jan. 13, 2011

Related U.S. Application Data

(63) Continuation of application No. PCT/GB2007/003086, filed on Aug. 14, 2007.

(30) Foreign Application Priority Data

Aug. 14, 2006 (GB) .................................. 0616125.1

(51) Int. Cl.
*H01L 21/3065* (2006.01)
*H01L 21/311* (2006.01)

(52) U.S. Cl.
CPC ...... *H01L 21/3065* (2013.01); *H01L 21/30655* (2013.01); *H01L 21/31116* (2013.01)
USPC ........... 438/652; 438/700; 438/710; 438/712; 257/E21.218

(58) Field of Classification Search
USPC .......................... 438/652, 700, 710, 712, 719; 257/E21.218
See application file for complete search history.

(56) References Cited

U.S. PATENT DOCUMENTS

| 4,330,384 A | * | 5/1982 | Okudaira et al. ......... 204/192.37 |
| 5,498,312 A | * | 3/1996 | Laermer et al. ............... 438/695 |
| 6,551,939 B2 | * | 4/2003 | Takamatsu et al. ........... 438/706 |
| 6,878,608 B2 | * | 4/2005 | Brofman et al. ............. 438/459 |
| 2006/0128159 A1 | | 6/2006 | Hillyer et al. |

FOREIGN PATENT DOCUMENTS

| DE | 42 02 447 A1 | 7/1992 |
| WO | WO 03/060975 A | 7/2003 |

OTHER PUBLICATIONS

The International Search Report for corresponding PCT Application No. PCT/GB2007/003086, mailed on Jun. 20, 2008.
Ooka et al. "Contact-Hole Etching With NH3-Added C5F8 Pulse-Modulated Plasma." Japanese Journal of Applied Physics. 44(9A):6476 (2005), 1 page.

* cited by examiner

*Primary Examiner* — Michael Trinh
(74) *Attorney, Agent, or Firm* — Knobbe, Martens, Olson & Bear LLP

(57) ABSTRACT

A method for anisotropically plasma etching a semiconductor wafer is disclosed. The method comprises supporting a wafer in an environment operative to form a plasma, such as a plasma reactor, and providing an etching mixture to the environment. The etching mixture comprises at least one etch component, at least one passivation component, and at least one passivation material removal component.

10 Claims, 6 Drawing Sheets

METHOD OF ETCHING A SEMICONDUCTOR WAFER

RELATED APPLICATIONS

This application is a continuation of PCT/GB2007/003086, filed 14 Aug. 2007, which was published in English and designated the U.S., and claims priority to GB 0616125.1 filed Aug. 14, 2006, each of which are incorporated herein by reference.

BACKGROUND OF THE INVENTION

1. Field of the Invention

The present invention relates to a method for anisotropically etching a wafer by means of a plasma, in particular but not exclusively anisotropically plasma etching a deep etch feature into a semiconductor wafer.

2. Description of the Related Art

Etching deep features, or "through wafer" features such as via holes, in semiconductor wafers such as silicon have been achieved using the so-called "Bosch" process. The Bosch process was developed by Laermer and Schlip [1,2,3,4] at Bosch Routington Germany.

Referring to FIG. 1, the process etches deep or "through" structures 14 in a silicon wafer 10 in a pattern defined by a mask 12, such as a photoresist layer, using cyclic etch and deposition steps. The etch step uses a sulphur hexafluoride ($SF_6$) plasma, some times with a small amount oxygen ($O_2$), and then a deposition step using octofluorocyclobutane ($C_4F_8$) for the deposition of a fluorocarbon polymer ($CF_{2n}$). The polymer is deposited on all surfaces of the etched feature. The sidewall deposition of the polymer is important for maintaining the anisotropic character of the etched feature as it inhibits etching of the sidewall thereby reducing under-etching.

During the etch cycle fluorine ions and free radicals (responsible for the lateral etching) in the plasma remove the polymer which has been deposited on the base or bottom wall of the etched feature exposing the silicon to more etching at the base or bottom wall whilst the polymer deposited on the sidewalls inhibits and reduces etching by free radicals. Just before the side wall deposition is removed the etch step is stopped and the deposition step starts again. The etch and deposition step is called a cycle and many cycles are required to etch through the silicon wafer. The etch features are formed through a plasma mask such as a polymer resist or oxide mask.

The known process forms an uneven surface "scalloping" 16 on the side wall of the etch feature 14 due to the cyclic nature of the process as illustrated schematically in FIG. 1 and shown in the micrograph shown in FIG. 2.

FIG. 2 shows an end view of a trench having an oxide mask 22, and shows that even when the scalloping 24 is small the sides 26 are not smooth. The process is sensitive to many parameter changes which may make it difficult to etch features accurately and reproducibly.

In the Bosch process wafer temperature control is very important as it affects the polymer thickness, free radical activity and mask selectivity. Lower temperatures have a benefit of improving the mask life but can promote more polymer growth on the wafer base, such excessive polymer formation causing so-called "grass" formation at the base of the etched feature. Typical grass formation 30 is shown in the micrograph of FIG. 3 where the temperature of the electrostatic chuck holding the wafer has changed from 10° C. to −10° C. Low temperatures can also cause thick resist masks to crack.

Lowering of surface temperature increases the $CF_{2n}$ sticking coefficient which also increases polymer growth and not only increases grass formation, but can cause profile control problems. Other changes in profile control are from changes in free radical loading such as changes in exposed silicon etching area and feature size. For example, small features etch slower than large features as there are fewer radicals available due to the collimation effect of the features on the free radicals.

Ions entering the dark space sheath of the etching plasma are accelerated by the sheath field and impact onto the substrate at an angle substantially normal to the wafer plane increasing the anisotropic etching. Free radicals enter the sheath with a wide spread in distribution. As the etched feature becomes deeper the collimation affects the etch/deposition balance so the process needs to be changed during the wafer etch. Typical profile problems 40 are shown in the micrograph of FIG. 4.

Although it is possible to correct profile problems by parameter ramping control to change the balance of the etch/deposition ratio whilst etching through the wafer, such an approach requires extensive tests to establish profile control and can cause further roughing of the side wall.

The Applicant has recognized that many of the problems with the Bosch type process may be solved if the polymer was only deposited on the side wall and the process was continuous, i.e. none cyclic, which will not form scallops or side wall roughening, and that it is far better to develop continuous stable plasma etch process.

One method attempted by the Applicant was to help reduce scalloping for smoother side walls by using short cycle times less than 3 seconds which produces small scallops. This gives system control problems of power, pressure, and flow as the move to lower residence times results in unrepeatable runs often from matching network and flow response being too slow for these steps.

The Applicant has tried the foregoing approach with a high oxygen addition to a $SF_6$ and $C_4F_8$ discharge. Here the $O_2$ produced $O^+$ ions which removed the polymer at the base. However the $O_2$ free radicals were found to be very reactive and dissociate the $C_4F_8$ too much and also removed the side wall polymer causing severe undercut. In addition the oxygen oxidizes the silicon surface reducing the etch rate to the fluorine radicals and ions.

Aspects and embodiments of the present invention were devised with the foregoing in mind.

SUMMARY OF THE INVENTION

Viewed from a first aspect the present invention provides a method for anisotropically plasma etching a semiconductor wafer. The method comprises supporting a wafer in an environment operative to form a plasma and providing an etching mixture to the environment. The etching mixture comprises at least one etch component for etching the wafer, at least one passivation component for depositing passivation material on the wafer, and at least one passivation material removal component for removing passivation material deposited on a wall of a closed end of an etch feature of the wafer, when the etching mixture is in a plasma state. The method further comprises forming a plasma of the etching mixture in the environment for etching the wafer.

The passivation material removal component may substantially remove the passivation material from the closed end wall whilst substantially leaving the passivation material on the side walls which leads to the closed end wall being etched whilst etching of the side walls is inhibited. Thus, etching, passivation deposition and passivation removal may occur together. Thus, there is no need for the process to comprise a series of steps but can be continuous or at least substantially so, thereby promoting an anisotropic and smooth profile of the etch feature. This is particularly useful for forming deep etch features as avoiding the formation of isotropic deep etch features with rough side walls can be problematic. Additionally, since the process may be substantially continuous it is easier to control and may be shorter than a cyclic process.

Suitably, the etch component comprises a halogen gas which is of a class of chemicals suitable for plasma etching a semiconductor wafer. The passivation component is typically a halocarbon which is suitable for forming a polymer passivation material, and the passivation material removal component comprises nitrogen. Nitrogen or compounds comprising nitrogen are particularly suitable as components which when in a plasma preferentially remove or inhibit the deposition of the passivation material from a closed end wall of an etch feature as nitrogen free radicals are less reactive than oxygen free radicals for example and so remove or inhibit passivation material deposition on sides walls to a lesser extent than oxygen free radicals, and to a much lesser extent compared to the removal or inhibition effect of nitrogen ions on passivation material at the closed end wall (base of the etched feature). The compounds containing nitrogen when in plasma provide nitrogen ions and free radicals which act to remove or inhibit passivation material deposition on the side walls. The Nitrogen ions are accelerated by the dark space sheath and impact normally at the base of the feature there by preventing polymer passivation at the base. This process does not remove any side wall polymer, or at least very little compared to the removal of polymer passivation at the base, which is needed to ensure smooth anisotropic etched features.

The halocompound may be a fluorochemical and may comprise at least one of Sulphur Hexafluoride ($SF_6$), Nitrogen Trifluoride ($NF_3$) and Chlorine Trifluoride ($ClF_3$). Nitrogen Trifluoride may be particularly effective as an etch component as it produces more fluorine ions and free radicals per plasma electron impact when in a plasma state compared to Sulphur Hexafluoride. Chlorine Trifluoride may be particularly suitable for low temperature etch applications as it reacts with silicon and germanium at room temperature.

The polymer forming component may be one or more of Octofluorocyclobutane ($C_4F_8$), Tetrafluoroethane ($C_2F_4$), Trifluoromethane ($CHF_3$) and Hexafluorocyclopropane ($C_3F_6$) which are suitable for forming a polymer under plasma conditions.

Ammonia ($NH_3$) is particularly suitable as a component for removing or inhibiting passivation material deposition as it is a source of nitrogen free radicals and ions whose ionic bonds can be broken with 10 eV in a plasma to create ions and free radicals, whereas the ionic bond of nitrogen gas ($N_2$) for example has a triple bond requiring a higher energy (about 20 eV) to break the bond.

Suitably, the passivation removal component comprises at least 5% ammonia with a substantially nitrogen ballast.

Typically, a mask (Photoresist or Plasma Enhanced Chemical Vapor Deposition) PECVD oxide) is deposited over the wafer for etching out the deep features.

In accordance with one embodiment of the invention the wafer comprises a first surface patterned with at least one conductive pad, the method further comprising forming a protective layer over the first surface and etching a deep etch feature from a second surface of the wafer exposing the first surface to the at least one mask layer for providing a via hole to the at least one mask layer from the second surface.

Examples of suitable wafer materials are silicon (Si), germanium (Ge) and silicon nitride ($Si_2N_3$).

A plasma reactor may provide a suitable environment for forming and supporting a plasma.

Viewed from a second aspect the present invention provides a method for filling a deep etch feature formed in a wafer with a metal such as aluminum or copper, the method comprising metal vapor deposition of a seed layer of metal on a bottom wall of the deep etch feature. Typically, the seed layer is deposited on a metallic bottom wall of the deep etch feature, for example a deep etch feature providing a via hole through a wafer to a conductive pad such as described above. Vapor deposition of a metal is a particularly effective way of depositing metal in a deep etch feature, for example where sputter techniques are ineffective. The metallic bottom wall comprises electrons which attract the metal ions in the vapor thereby preferentially forming the seed layer over the metallic bottom wall.

Suitably, the metal vapor is a copper vapor formed by a copper hexafluoroacetylacetonate process (Cu(HFAC)).

The via hole may be filled with a metal, for example by placing the wafer in an electroless bath in order to fill the hole with a metal which finds good adherence to the seed layer at the bottom of the hole. When the electroless method is used with a wafer having via holes formed by the deep etch method described above, cavitation, and hence the production of bubbles, may be reduced in the electroless plating liquid proximal the side walls compared with via holes formed by conventional deep etch methods such as the Bosch method, as the side walls formed in accordance with an embodiment of the invention may be smoother than the side walls formed by the Bosch method.

The use of a new trench deep etch process helps in the manufacturability of a back side etch process allowing another level of integration of ASIC type circuitry into a wafer substrate for a high energy detector substrate. High voltage (HT) connections may be made through the ASIC and to the front face of the detector material, for example to provide bias voltages.

The use of copper (HFAC) as a seed layer in the aluminum contact pad keeps the metallization simple and allows the use of thin aluminum pad materials on the ASIC wafer whereas there is too little aluminum metallization for a Zincate treatment prior to a nickel (Ni) process.

The new plasma trench deep etch process may remove or at least reduce the problems with side wall roughness, grass formation and trench profile found with conventional deep etch processes, and may increase the throughput for manufacturing silicon trench etched wafers. The selective chemical vapor deposition (CVD) copper seed process (HFAC process) and copper trench fill gives another level of integration for detector fabrication and allows the front side free for further processing and integration.

BRIEF DESCRIPTION OF THE DRAWINGS

FIG. 10 (b) schematically illustrates an electroless gold process for plating the copper filed via hole with gold.

DETAILED DESCRIPTION OF THE INVENTION

Specific embodiments in accordance with the present invention will now be described, by way of example only, and with reference to the drawings briefly described above.

Viewed from a general perspective an embodiment in accordance with the present invention provides a new advanced through the wafer etch process for the fabrication of deep etch features, whilst a second embodiment provides a new process for the fabrication of a substrate for a 3D high performance radiation detector. This process involves a trench hole etch through the wafer so that contact can be from the back of an Application Specific Integrated Circuit (ASIC) wafer. This allows a further level of integration. The etch process is based on a new development in wafer etching and copper via hole fill.

For such an embodiment, anisotropic etching is important. The deep etched features should have side walls which are as straight (vertical) as possible, and the edges of the mask patterns covering the wafer surface should not be under etched in order to maintain the precision of the structural transition from the mask into the wafer as high as possible. Therefore, preferential etching at an end or closed wall of such a deep etch feature is desirable.

Figure 1:
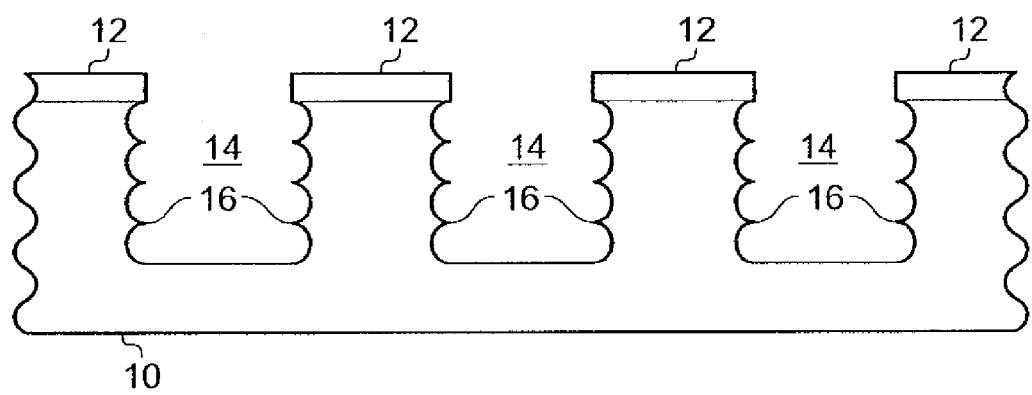
FIG. 1 schematically illustrates deep etch features formed using a conventional deep etch process.
Figure 2:
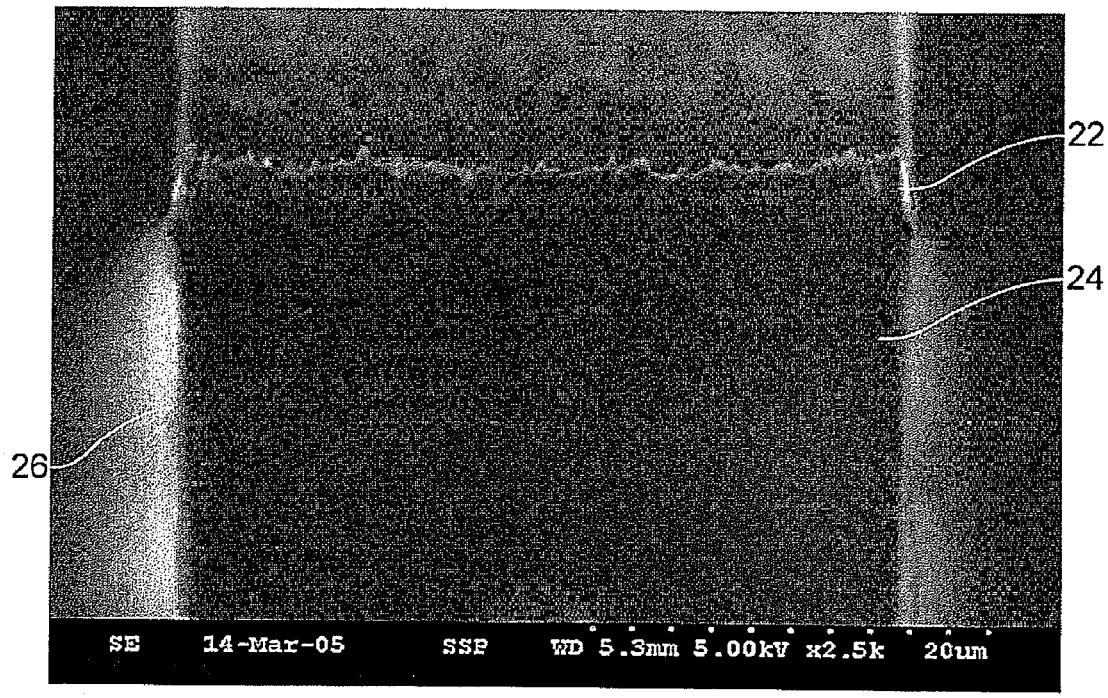
FIG. 2 is a micrograph showing the side walls of a deep etch feature formed using a conventional deep etch process.
Figure 3:
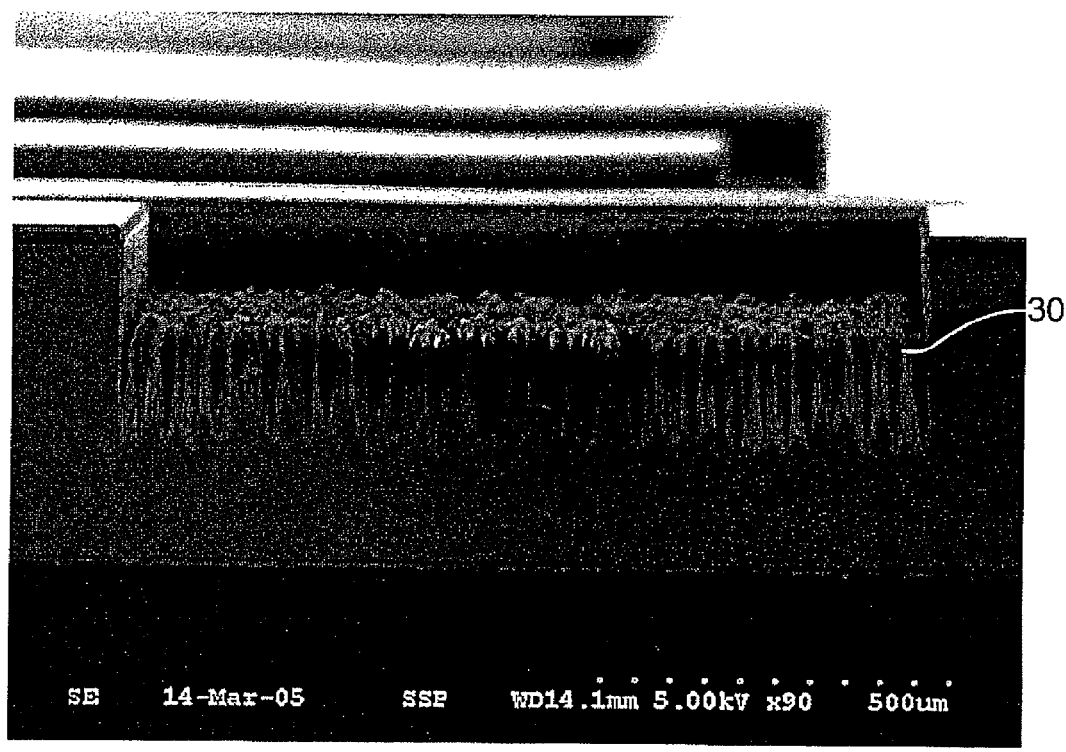
FIG. 3 is a micrograph showing grass formation in a deep etch feature formed using a conventional deep etch process.
Figure 4:
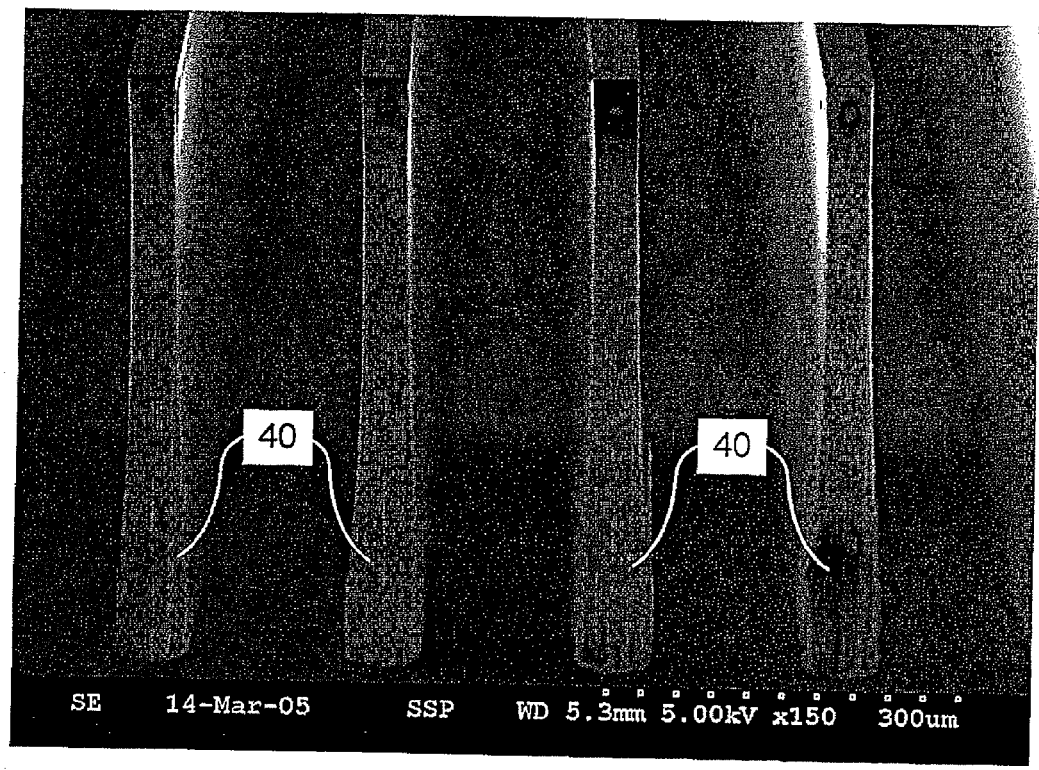
FIG. 4 is a micrograph showing profile problems in a deep etch feature formed using a conventional deep etch process.
Figure 5:
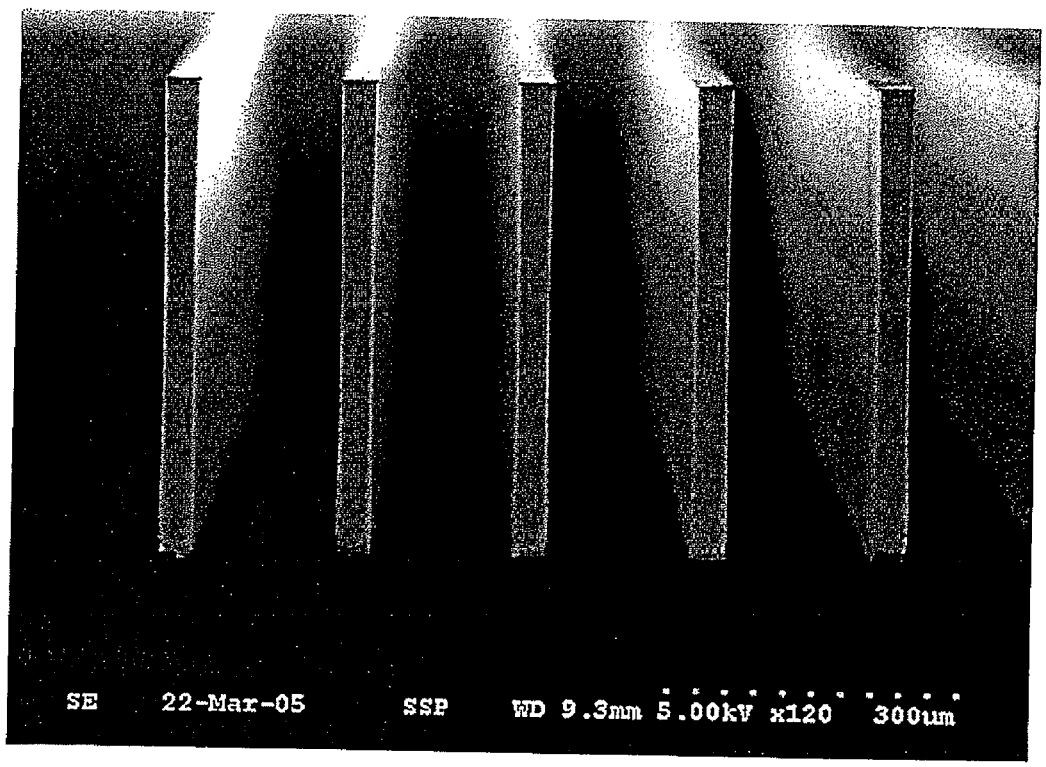
FIG. 5 is a micrograph showing etch features formed by a process in accordance with an embodiment of the present invention.
Figure 6:
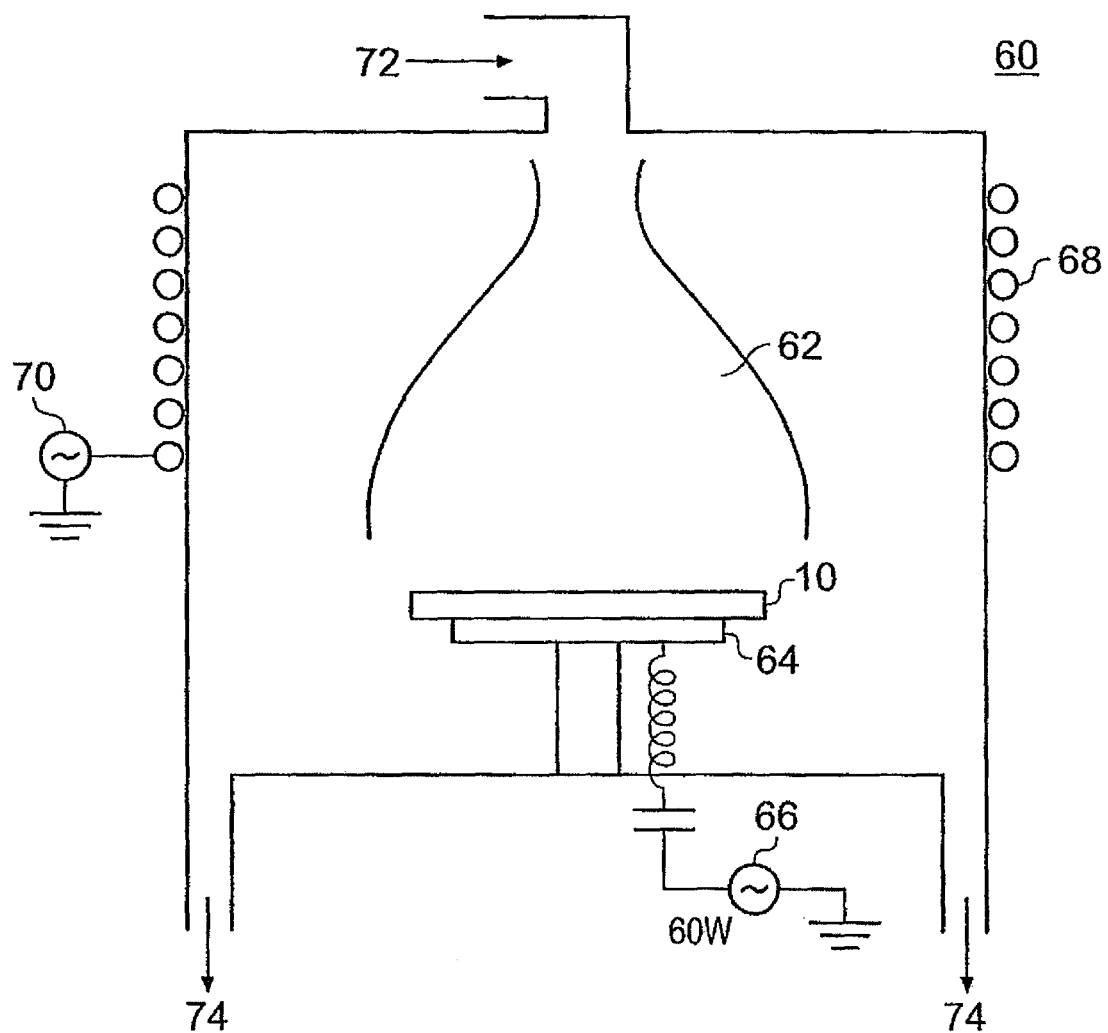
FIG. 6 is a schematic illustration of a plasma reactor for an embodiment of the present invention.

FIG. 6 illustrates an inductive coupled plasma (ICP) reactor etching chamber 60 which provides an environment suitable for forming and maintaining an etching plasma 62. An ICP reactor is particularly suitable as it provides control of the ion density in the plasma by controlling the coil energy. Such control of the ion density also provides control of the ion impact energy and vacuum. Additionally, an ICP reactor can create plasma from materials with a relatively low volatility such as in etching aluminum using hydrogen iodide (HI) gas. The reaction product aluminum iodide ($AlI_3$) is not volatile but with ion impact it may be driven into the gas phase via sublimation in accordance with the following.

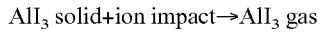

$AlI_3$ solid+ion impact→$AlI_3$ gas

A wafer 10 is supported by a wafer substrate electrode 64 connected to a 60 W high-frequency electrical power supply 66 operating in a frequency range from 2.0 MHz to 40 MHz. Coils 68 for promoting and maintaining a plasma discharge in the plasma reactor chamber 60 are coupled to a 2000 W high-frequency electrical power supply 70, again typically operating in a frequency range from 2-40 MHz.

In general, plasma-etching forming of deep etch features in wafers such as silicon substrates utilizes a chemically reactive species and electrically-charged particles (ions) which are generated in a reactive gas mixture in the plasma reactor 60 with the aid of an electric discharge. The positively-charged ions generated in the plasma accelerate towards the wafer 10 due to an electrical RF induced bias applied to the wafer 10 via wafer electrode 64 and power supply 66. The electrical RF induced bias to wafer 10 causes the ions to accelerate on to the wafer surface at an angle which is substantially perpendicular to the wafer surface, and promotes the chemical reaction of the reactive plasmas species with the silicon wafer. Additionally, the dark sheath region of the plasma may create an electric field gradient which accelerates the ions towards wafer 10.

The plasma reactor etching chamber 60 is maintained at a low pressure of typically between 2 and 5 mtorr, and the vacuum is maintained by way of exhaust pumps 74, which also carry away reaction products of the plasma etching process.

The plasma reactor etching chamber 60 illustrated in FIG. 6 is by way of example only, and is not intended to be limiting in terms of the manner in which embodiments of the present invention may be implemented. Embodiments in accordance with the present invention may be performed with other forms of chamber suitable for providing an environment which support a plasma.

Plasma etching may be carried out by halochemicals, but it is known that fluorochemicals are highly reactive and whilst providing a very high etching rate and high selectivity tend to etch isotropically. Conversely, while other halogens such as chlorine and bromine are less reactive, they are sensitive to moisture and require a virtually moisture free environment.

In a first embodiment of the present invention, an etching mixture 72 comprising an etch component sulphur hexafluoride ($SF_6$), a passivation component octofluorocyclobutane ($C_4F_8$), a passivation removal component ammonia ($NH_3$) and a ballast of nitrogen gas ($N_2$) is introduced into the plasma reactor 60. The flow rate for the sulphur hexafluoride is typically 300 standard cubic centimeters (sccm), the flow rate for the octofluorocyclobutane is typically 100 sccm, and the flow rate of $N_2$ (with 5% $NH_3$) is 260 sccm.

The power supplies 66 and 70 are activated and a plasma 62 of the etching mixture 72 initiated and maintained in plasma reactor etching chamber 60. A silicon wafer 10 having an etch resist mask patterned onto its upper surface is mounted on wafer electrode 64.

Figure 7:
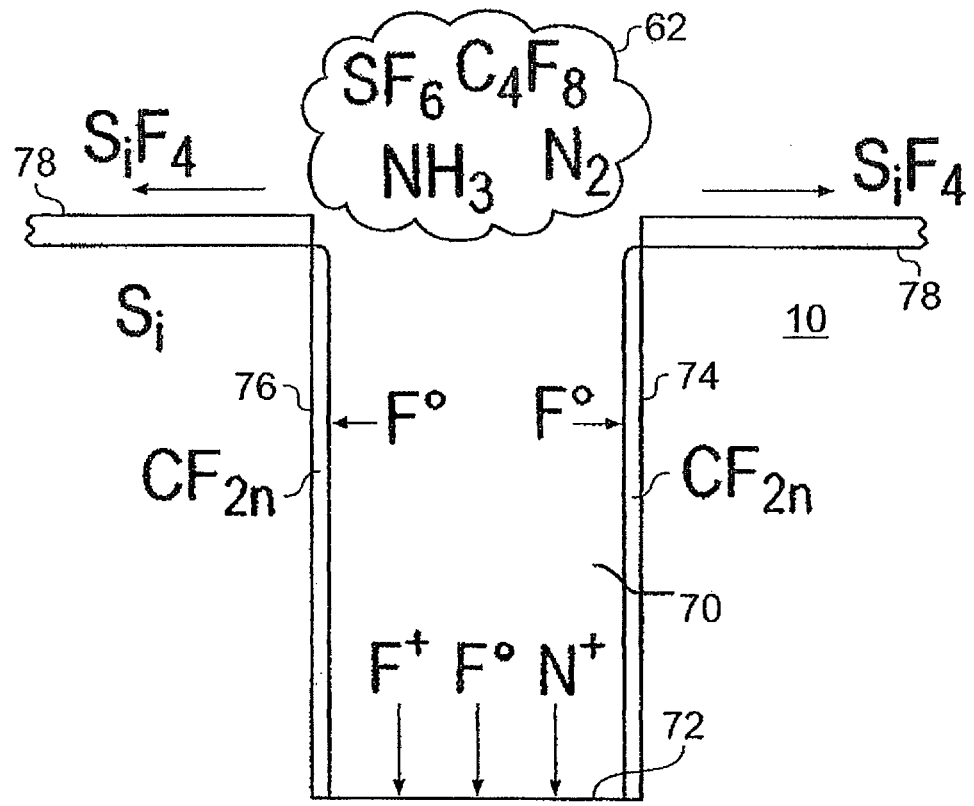
FIG. 7 is a schematic illustration of an etch process in accordance with an embodiment of the present invention.
Figure 8:
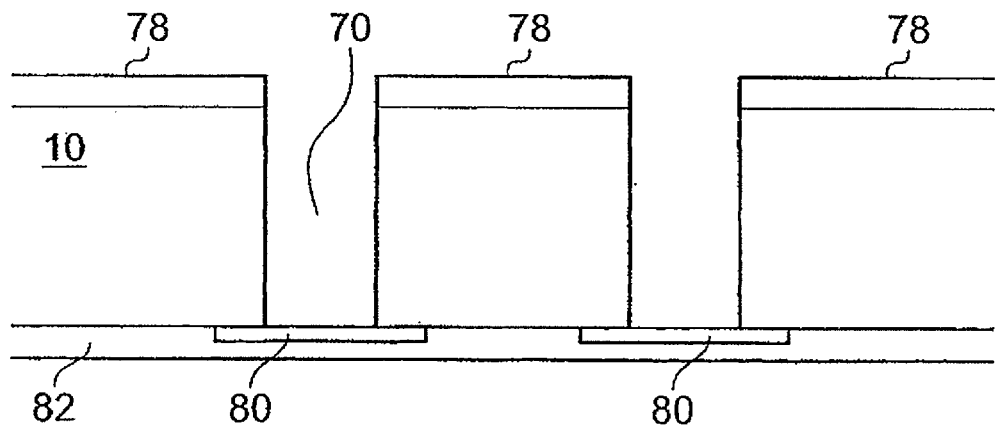
FIG. 8 schematically illustrates an ASIC having via holes formed through it to aluminum contact pads in accordance with an embodiment of the invention.

The process for etching wafer 10 will now be described with reference to FIG. 7.

The etching process is based on the inclusion of a passivation removal component comprising a nitrogen containing chemical in the etching mixture 72. In the described embodiment the primary passivation removal component is ammonia. This is because it is easier to create nitrogen ions from ammonia as the ionic bond is only 20 eV, compared with creating nitrogen ions from nitrogen gas which has a trivalent 30 eV bond.

Plasma 62 includes fluorine ions $F^+$ and fluorine free radicals $F°$ created from the sulphur hexafluoride etch component. The fluorine ions and free radicals etch wafer 10 through the etch resist mask 78 by reacting with the silicon to form Silicon Difluoride ($SiF_2$) and finally Silicon Tetrafluoride ($SiF_4$) which are volatile species and are pumped away by the vacuum pumps 74. The etch mask is silicon oxide and may be formed by plasma enhanced chemical vapor deposition. Optionally, the mask may be a thick layer of photoresist.

Due to the pre-stress voltage applied to the wafer 10 via the wafer electrode 64 the fluorine ions are accelerated towards the wafer and are incident on the wafer substantially perpendicular to the wafer surface. Consequently, the fluorine ions tend to etch in a direction substantially perpendicular to the surface of wafer 10 and as the deep etch trench feature 70 forms so the fluorine ions tend to impact the bottom closed wall 72 of the deep etch feature 70 thereby preferentially etching the bottom wall 72. As the fluorine ions are accelerated towards the wafer the etch process is enhanced by the ion impact energy. The fluorine ions also tend to disrupt the surface of the silicon as well as reactively etch it, and this disruption aids the reactive etching.

The fluorine free radicals also etch the silicon, but as they are uncharged they tend to drift and therefore impact on the side walls 74, 76 as well as the bottom wall 72. Furthermore, the fluorine free radicals have less impact energy so the ion impact will drive the reaction faster since the ions impact can drive compounds into the gas phase faster exposing more silicon.

At the same time as the fluorochemical etching, the passivation component octofluorocyclobutane forms a polymer layer CF2n-type from the plasma 62 over the surface of the wafer, including the side and bottom walls 72, 74 and 76. The polymer layer may be a polymer such as an unsaturated PTFE like film, a polyflurodiene or polyflurodiane depending on the level of unsaturated bonds. The polymer layer inhibits and may even prevent the fluorine free radicals from etching the silicon since the formation of the polymer may occur at a faster, or at least substantially equivalent, rate compared to the rate at which the free radicals can remove the polymer. Thus, the sidewalls may remain free from etching by the fluorine free radicals thereby establishing and maintaining good lateral integrity of the side walls and avoiding rough side wall surfaces and profile problems.

Nitrogen ions (N+) created in the plasma 62 from the ammonia are accelerated under the influence of the pre-stress voltage, and may also be accelerated by the electric field in the dark sheath region of plasma 62, and preferentially impact on the bottom wall 72 and act to inhibit formation on or remove the polymer from the bottom wall (trench base) 72, whilst leaving the polymer on the side walls relatively intact. Thus, the bottom wall 72 may still undergo fluorine ion etching as the polymer has been inhibited from forming on it or removed from it, whilst the anisotropic and smooth profile of the trench deep etch feature 70 is maintained.

As nitrogen free radicals are less reactive than oxygen free radicals for example, removal of the polymer layer occurs at a much slower rate with nitrogen free radicals compared to oxygen free radicals. Additionally, oxygen ions are highly reactive and tend to disassociate the octofluorocyclobutane too much leading to removal of the sidewall polymer and therefore promoting under-etching. This further maintains the integrity of the polymer layer on the side walls and hence the anispric structure of the deep etch feature 70.

In other words, by using $N_2$ additions to the $SF_6/C_4F_8$ discharge there is less risk to the side wall polymer being removed by the $N_2$ free radicals as the reactivity is much lower and has less effect on the $C_4F_8$ polymer fragmentation process. Although the $N_2$ radicals are less reactive the $N_2$ ions are reactive and remove the polymer from the etch base only since they are accelerated normal to the surface via the sheath potential. Any silicon nitride surface formation from the N+ ion impact will not slow down the fluorine etch unlike oxide formation. Nitrogen addition also helps increase the plasma density.

The reaction for O* and N* radicals and ions on the polymer plus dissociated components and $C_4F_8$ can be summarized as:—

$C_xF_{2y}+O^* \rightarrow CO+COF_2+OF^*$ fast reaction.
$C_xF_{2y}+O+ \rightarrow CO+COF_2$ very fast reaction.
$C_xF_{2y}+N^* \rightarrow CN+C_{x1}-NF_{2y}$ very slow reaction with $N_2$ radicals but with N+ ions the reaction proceeds faster. The ion impact also helps product volatility.

In one embodiment, the wafer 10 comprises an ASIC having aluminum electrical contact pads 80. The ASIC is protected through the etch process by a polyimide layer 82 which is formed on the ASIC part of wafer 10 prior to plasma etching. The deep etch feature 70 is formed from an opposite side of the ASIC to the contact pad 80 and forms a via hole to the contact pad. The deep etching trench feature 70 stops on the aluminum contact pad 80 oxide of the front of the ASIC wafer 10.

Once the etch has stopped on the aluminum oxide of the contact pad 80 the plasma etching process is halted and pure octofluorocyclobutane is provided to the plasma reactor. The aluminum oxide is removed using pure $C_4F_8$ plasma chemistry to expose the aluminum. The wafer is then resist stripped in acetone, washed, dried and inspected. The polyimide coating is left still intact on the front of the wafer to protect the CMOS devices, so aggressive cleans are still not used at this stage of the process.

After cleaning the wafer is exposed to HFAC (copper precursor) vapor which at low temperature allows the copper to undergo a selective disproportion reaction and deposits copper only on the exposed aluminum contact pads 82 on the back of the wafer 10. CuHFAC-VTMS (vinyltrimethylsilane) is a CVD process and is selective between 120-200° C. and deposits non-selectively between 200-420° C. at 100-900 mtorr.

Figure 9:
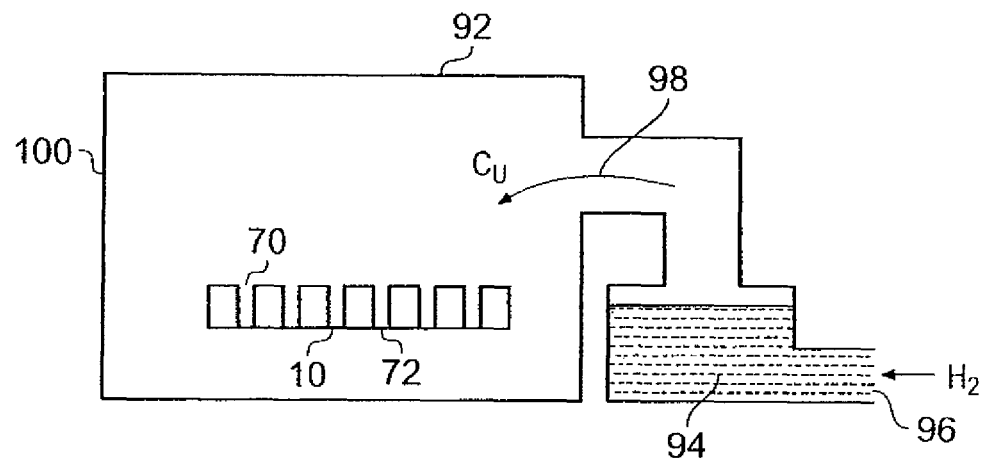
FIG. 9 schematically illustrates a copper HFAC deposition process for seeding a via hole in an ASIC formed in accordance with an embodiment of the present invention.

As illustrated in FIG. 9, the wafer is placed into a CuHFAC low pressure oven 92 at 150° C. for selective copper deposition of copper on the backside of the aluminum contact pads 72 of wafer 10. The CuHFAC-TMVS precursor 94 is held at 40° C. and helium (He) 96 is bubbled through the CuHFAC-TMVS precursor carrying the copper precursor 98 into the process chamber 100.

The copper precursor 98 makes its way down the via holes 70 and deposits on the aluminum contact pads 72 to form a copper seed layer.

Deposition of the copper precursor is achieved via a disproportion reaction, where copper in the $1^+$ valence state changes. Half to zero state metal deposition and the other half goes to the $2^+$ state and remains volatile.

$2\ Cu^+(HFAC)\ (tmvs) \rightarrow Cu^{++}(HFAC)_2 + Cu^0 + tmvs.$

The copper metal (at zero state) deposits only onto the exposed aluminum pads.

HFAC (HexaFluroACetylacetonate) comes from the Schumacher Cupra select precursor and is Tri-methylvinylsilyl, hexafluro-acerylacetonate $Cu^+$ which eliminates the tri-methylvinylsilyl (tmvs) and deposits Cu onto the Al surface. The hexafluro-acetylacetonate bonds to another $Cu^+$ to for the $Cu^{++}$.

This selective copper deposition forms the seed layer for an electroless deposition process.

The HFAC process is supplied by Schumacher (part of Air Products and Chemicals, Inc.) as the Cupra Select™ process, and further information regarding the process may be obtained from Air Products and Chemicals, Inc.

Figure 10A:
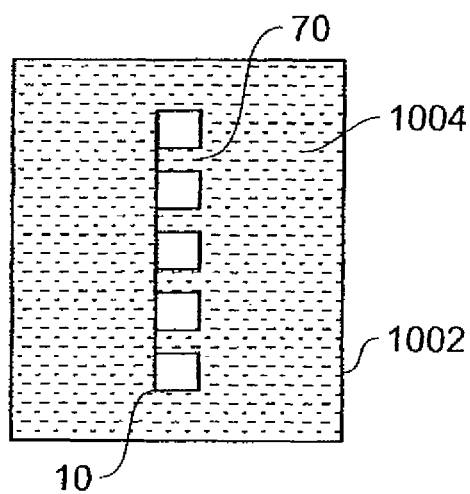
FIG. 10 (a) schematically illustrates an electroless copper fill process for filling a via hole with copper.
Figure 10B:
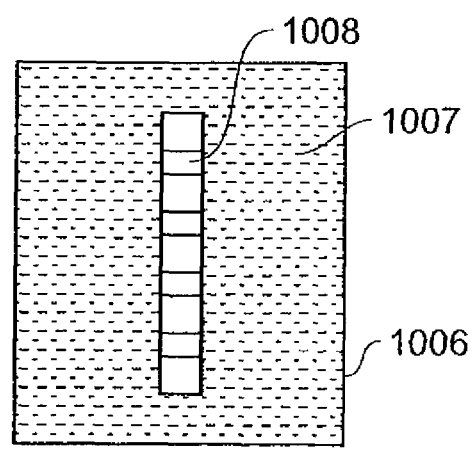

The wafer 10 is placed into an electroless copper plating bath 1002 of copper electroless plating solution 1004 as illustrated in FIG. 10 for rapid growth of copper onto the seed layer. A suitable composition is copper sulfate (0.032 M), 1,5,8,12 tetraazadodecane (0.04 M), triethanolamine (0.3 M), and dimethylamine borane (0.067M). The additive of choice is 2,2' dipyridyl in a concentration range of 30-300 ppm. The pH of the bath should be adjusted to 9 at 20° C.

The copper fills the deep etch trench feature 70 almost to the wafer surface plane. After washing in acetone and rinsing in de-ionized water, the wafer 10 is then placed into an electroless gold plating path 1006 of gold electroless plating solution 1007 for 1 μm deposition of gold to prevent oxidation of the copper surface 1008 at the end of the via holes and to ensure easy back side wire bonding. The gold plating solution may be HGS 5400 available from Hitachi Chemical Co. Ltd.

The polyimide front protection can now be removed using amino hydroxides, and washed and dried.

After processing the protective (partly cured) polyimide film on the front of the wafer to protect the ASIC can be removed, for example, for dicing and flip chip operations and mounting of the ASIC onto the sides of a high energy detector CdZnTe substrate block.

The capability of a backside etch and trench fill process will allow direct deposition onto the front side of wafers having structures and features built on the front side. For example, new types of high-energy radiation detectors may have radiation detection materials such as $PbI_2$, ThBr, $HgI_2$, InI and amorphous Se directly grown or deposited onto the surface of a substrate wafer pixellated with an array of electrical contact pads. Via holes may then be made directly to the back surface of such contact pads. Furthermore, there will be no need to protect the bond pads on the front surface and risk contamination of the deposition process as the contact pads will already be protected by the radiation detector material. Additionally, the temperature deposition process limitation is only on the ASIC device of 400° C. and not the polymer pad protection limitation of 250-300° C.

In view of the foregoing description it will be evident to a person skilled in the art that various modifications may be made within the scope of the invention. For example, the passivation component may be tetrafluoraethane ($C_2F_4$), trifluoromethane ($CHF_3$) or hexafluorocyclopropane.

The process may be improved still further by replacing sulphur hexafluoride with nitrogen trifluoride thereby reducing sulphur deposition in the pumps and lines conveying the components to and exhausting residue from the system thereby reducing system downtime necessary for cleaning them of sulphur deposits. Chlorine fluoride ($ClF_3$) may also be used as an etching component, as can other halochemicals.

The wafer material need not be silicon, but may be another semiconductor material such as germanium (typically resulting in germanium fluoride as an etch product), or other material such as silicon nitride. Additionally, the electrical contact pads need not be aluminum, but may be of other suitable metal such as gold, platinum or silver or combinations thereof. Furthermore, the metal filling may be of a metal other than copper, for example aluminum.

As used herein, any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the invention. This is done merely for convenience and to give a general sense of the invention. This description should be read to include one or at least one and the singular also includes the plural unless it is obvious that it is meant otherwise.

The scope of the present disclosure includes any novel feature or combination of features disclosed therein either explicitly or implicitly or any generalization thereof irrespective of whether or not it relates to the claimed invention or mitigate against any or all of the problems addressed by the present invention. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

REFERENCES

[1] Laermer and Schlip Bosch development report 1990.
[2] Application notes on Bosch process STS 1995.
[3] U.S. Pat. No. 5,501,893.
[4] 2006/0141794A1
[5] Etching High Aspect Ratio Features in Si by Sergi Gomez et. al JVST Volume 23, No 6, 2005.
[6] Study of $C_4F_8/N_2$ and $C_4F_8/Ar/N_2$ plasmas for highly selective organosilicate glass etching over $Si_3N_4$ and SiC. By Xuefeng Hua et. al. JVST, Volume 21, No 5, 2003.
[7] Feature-scale model of Si etching in $SiF_6/O_2$ plasmas and comparison with experiments. By Rodolfo Jun et. al. JVST, Volume 23, No 6, 2005.
[8] Single wafer processing for selective CVD copper. John Norman, David Roberts and Art Hochberg, Schumacher technical report 1995.

What is claimed is:

1. A method of anisotropically plasma etching a semiconductor wafer, the method comprising a continuous process and further comprising:
supporting a wafer in an environment operative to form a plasma;
providing a reactive etching mixture comprising:
an etch component for etching said wafer, the etch component comprising chlorine fluoride ($ClF_3$);
at least one passivation component for depositing passivation material on said wafer; and
at least one passivation material removal component for removing passivation material deposited on said wafer; and
forming a plasma of said reactive etching mixture in said environment for etching said wafer, and wherein etching, passivation deposition and passivation removal steps occur together.

2. A method according to claim 1, wherein said passivation component comprises a halocarbon for forming a polymer passivation material, and said passivation material removal component comprises nitrogen.

3. A method according to claim 2, wherein said passivation component comprises at least one of octofluorocyclobutane ($C_4F_8$), tetrafluoraethane ($C_2F_4$), trifluoromethane ($CHF_3$) and hexafluorocyclopropane.

4. A method according to claim 2, wherein said passivation removal component comprises ammonia ($NH_3$).

5. A method according to claim 4, wherein said passivation removal component comprises at least 5% ammonia with a substantially nitrogen ballast.

6. A method according to claim 1, further comprising providing a plasma mask over said wafer for etching at least one feature into said wafer.

7. A method according to claim 6 wherein said at least one feature comprises a deep etch feature.

8. A method according to claim 7, wherein said wafer comprises a first surface patterned with at least one conductive pad, said method further comprising forming a protective layer over said first surface and etching a deep etch feature from a second surface of said wafer opposing said first surface to said at least one conductive pad for providing a via hole to said at least one conductive pad from said second surface.

9. A method according to claim 1, wherein said wafer comprises a one of silicon (Si), germanium (Ge) and silicon nitride ($Si_2N_3$).

10. A method according to claim 1, wherein said environment comprises a plasma reactor.

\* \* \* \* \*

UNITED STATES PATENT AND TRADEMARK OFFICE
CERTIFICATE OF CORRECTION

PATENT NO. : 8,759,214 B2
APPLICATION NO. : 12/377588
DATED : June 24, 2014
INVENTOR(S) : Russell Morgan It is certified that error appears in the above-identified patent and that said Letters Patent is hereby corrected as shown below:

In the Specification

In column 7 at line 46, change "anistropic" to --anisotropic--.

In column 8 at line 42, change "(HexaFluroACetylacetonate)" to --(HexaFluoroACetylacetonate)--.

In column 8 at line 44, change "hexafluro-acerylacetonate" to --hexafluoro-acetylacetonate--.

In column 8 at line 46, change "hexafluro" to --hexafluoro--.

In column 9 at line 28, change "tetrafluoraethane" to --tetrafluoroethane--.

In the Claims

In column 10 at line 61, in Claim 3, change "tetrafluoraethane" to --tetrafluoroethane--.

Signed and Sealed this
Seventeenth Day of February, 2015

Michelle K. Lee
*Deputy Director of the United States Patent and Trademark Office*